US012790716B2

(12) United States Patent
Kitagawa

(10) Patent No.: US 12,790,716 B2

(45) Date of Patent: Nov. 10, 2026

(54) METHOD FOR DETECTING SURFACE STATE OF RAW MATERIAL MELT IN A QUARTZ CRUCIBLE USING PARALLAX DATA FROM TWO CCD CAMERAS

(71) Applicant: SHIN-ETSU HANDOTAI CO., LTD., Tokyo (JP)

(72) Inventor: Katsuyuki Kitagawa, Nishigo-mura (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 458 days.

(21) Appl. No.: 18/276,463

(22) PCT Filed: Jan. 26, 2022

(86) PCT No.: PCT/JP2022/002751

§ 371 (c)(1),
(2) Date: Aug. 9, 2023

(87) PCT Pub. No.: WO2022/185789

PCT Pub. Date: Sep. 9, 2022

(65) Prior Publication Data

US 2024/0125006 A1 Apr. 18, 2024

(30) Foreign Application Priority Data

Mar. 1, 2021 (JP) ................................ 2021-031774

(51) Int. Cl.
*C30B 15/26* (2006.01)
*C30B 15/14* (2006.01)
*C30B 15/30* (2006.01)

(52) U.S. Cl.
CPC .............. *C30B 15/26* (2013.01); *C30B 15/14* (2013.01); *C30B 15/30* (2013.01)

(58) Field of Classification Search
CPC ......... C30B 15/00; C30B 15/14; C30B 15/20; C30B 15/26; C30B 15/30; C30B 29/00; C30B 29/02; C30B 29/06
(Continued)

(56) References Cited

U.S. PATENT DOCUMENTS

2011/0146564 A1 6/2011 Ohtsuna et al.
2018/0340269 A1* 11/2018 Kitagawa ................ C30B 15/20

FOREIGN PATENT DOCUMENTS

CN 106526122 A 3/2017
CN 108138353 A 6/2018
(Continued)

OTHER PUBLICATIONS

Mar. 22, 2022 International Search Report issued in International Patent Application No. PCT/JP2022/002751.
(Continued)

*Primary Examiner* — Kenneth A Bratland, Jr.
(74) *Attorney, Agent, or Firm* — Oliff PLC

(57) ABSTRACT

A method for detecting a surface state of a raw material melt in a crucible in single crystal production by a CZ method in which a single crystal is pulled from the raw material melt in the crucible including: photographing a predetermined same test region of the surface of the raw material melt in the crucible simultaneously in different directions with two CCD cameras to obtain measurement images; and automatically detecting, using parallax data of the measurement images from the two CCD cameras, one or more of the following: solidification timing when a state in which the raw material is completely melted becomes a state in which solidification is formed on the surface of the raw material melt; and melting complication timing when a state in which the raw material melt has solidification on the surface of the raw material melt becomes a completely melted state.

14 Claims, 3 Drawing Sheets

(58) Field of Classification Search
USPC ........ 117/11, 13–15, 35, 200–202, 206, 208, 117/214, 928, 931–932
See application file for complete search history.

(56) References Cited

FOREIGN PATENT DOCUMENTS

| | | | | | |
|---|---|---|---|---|---|
| CN | 110983439 | A | | 4/2020 | |
| DE | 112016004193 | T5 | | 5/2018 | |
| JP | H11236290 | A | | 8/1999 | |
| JP | 2000264780 | A | * | 9/2000 | |
| JP | 3632427 | B2 | | 3/2005 | |
| JP | 3704710 | B2 | | 10/2005 | |
| JP | 2007246356 | A | * | 9/2007 | ............ C30B 15/02 |
| JP | 2017-077981 | A | | 4/2017 | |
| JP | 6390606 | B2 | | 9/2018 | |
| JP | 2020045258 | A | | 3/2020 | |
| JP | 2020-055718 | A | | 4/2020 | |
| KR | 10-2018-0066095 | A | | 6/2018 | |
| WO | 02/10486 | A1 | | 2/2002 | |
| WO | 2010/047039 | A1 | | 4/2010 | |
| WO | 2017/068754 | A1 | | 4/2017 | |

OTHER PUBLICATIONS

Aug. 29, 2023 International Preliminary Report on Patentability issued in International Patent Application No. PCT/JP2022/002751.
Dec. 5, 2023 Office Action issued in Japanese Patent Application No. 2021-031774.
Apr. 2, 2024 Office Action Issued in Japanese Patent Application No. 2021-031774.
Sep. 16, 2025 Office Action issued in Korean Patent Application No. 10-2023-7028269.
Oct. 3, 2025 Office Action issued in Taiwanese Patent Application No. 111104229.
Apr. 1, 2025 Office Action issued in German Patent Application No. 112022000488.6.
Jul. 9, 2026 Office Action issued in Chinese Patent Application No. 202280014498.X.

* cited by examiner

【FIG. 1】
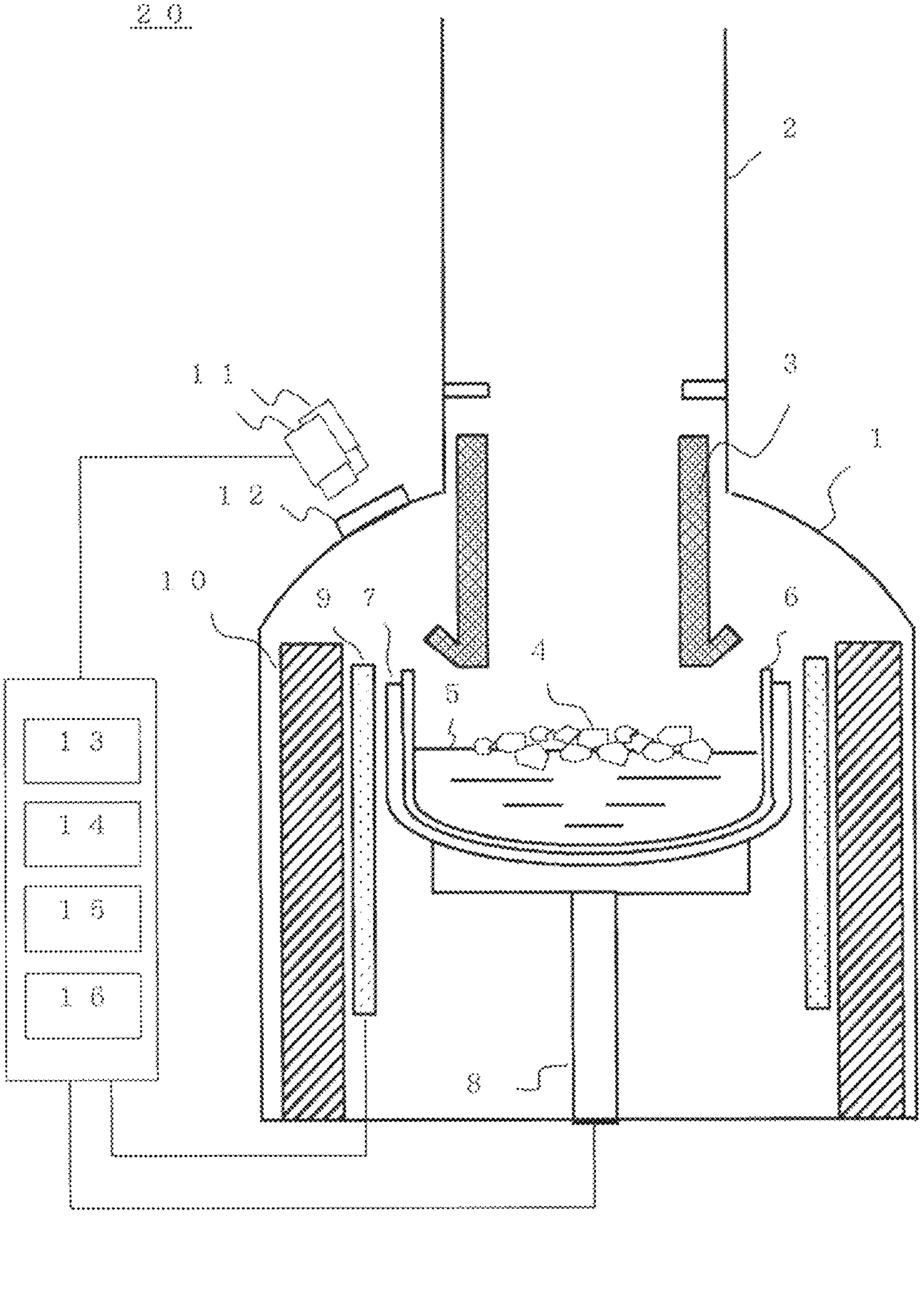

[FIG. 2]
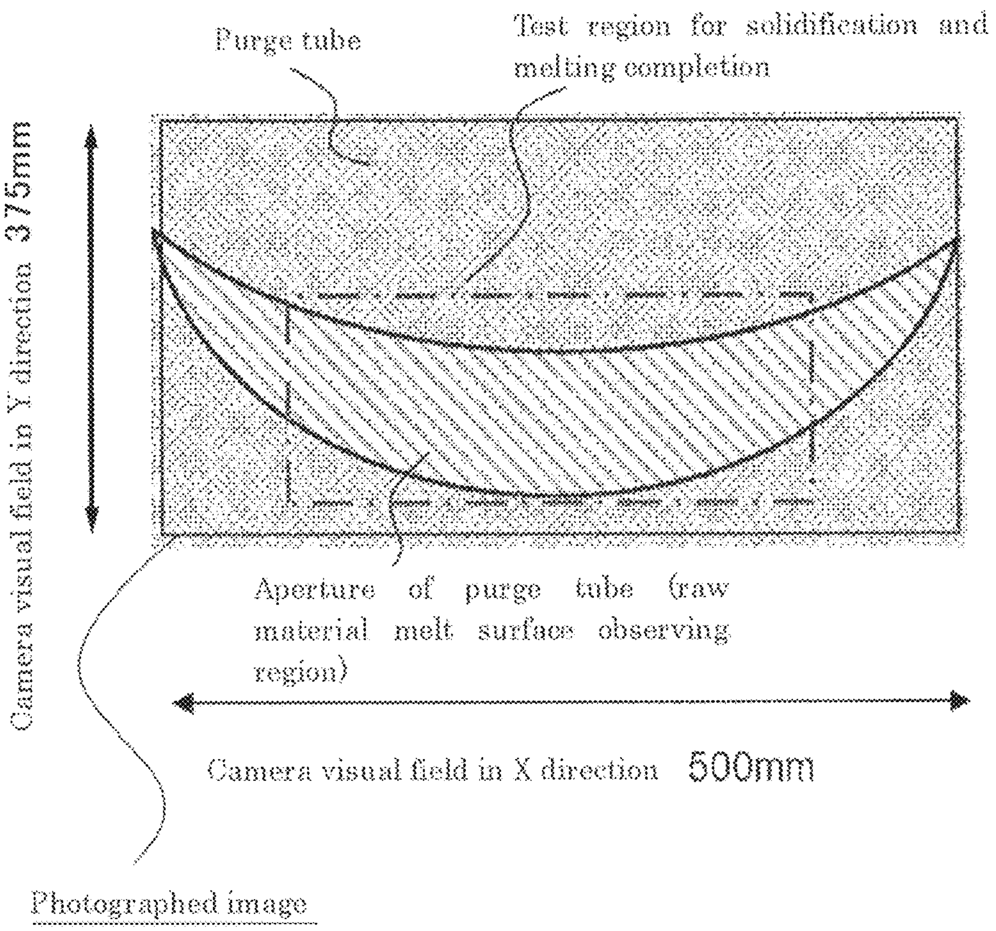
[FIG. 3]
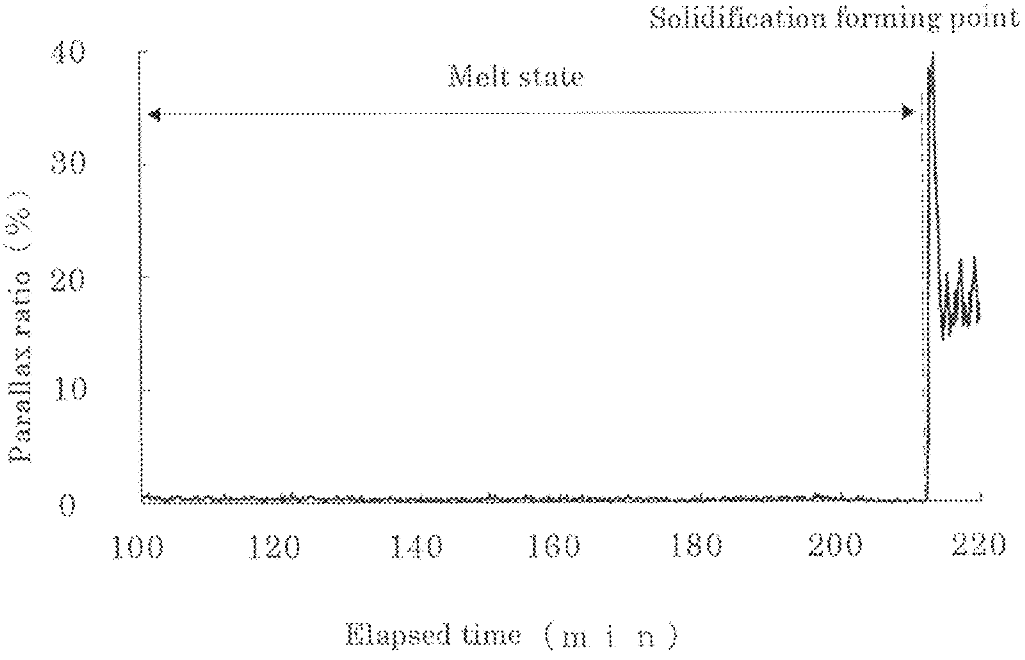

[FIG. 4]
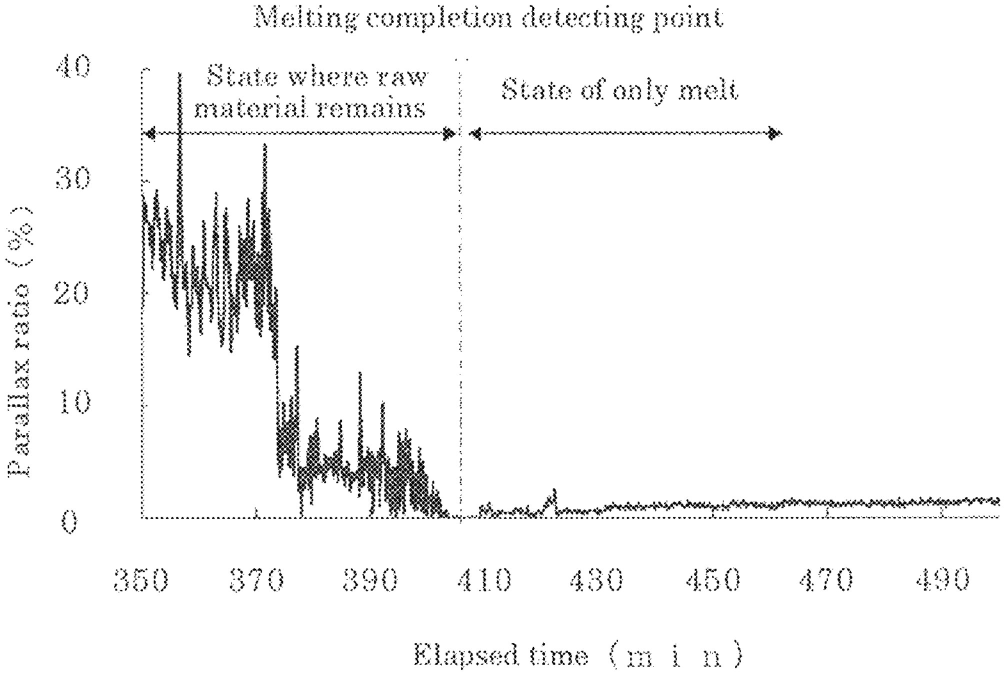
[FIG. 5]
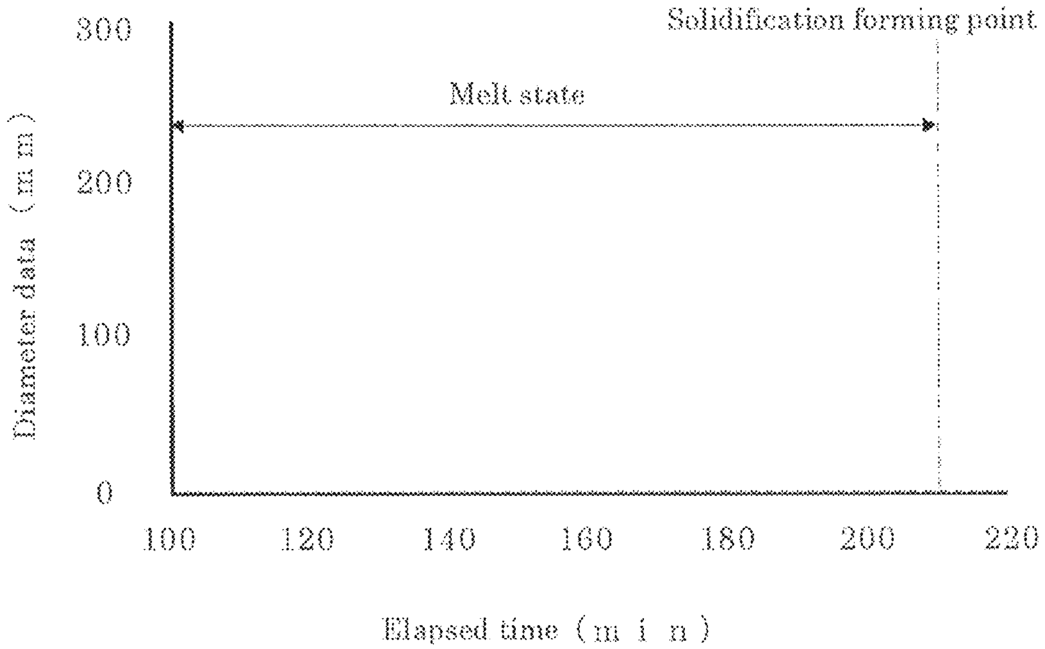

METHOD FOR DETECTING SURFACE STATE OF RAW MATERIAL MELT IN A QUARTZ CRUCIBLE USING PARALLAX DATA FROM TWO CCD CAMERAS

TECHNICAL FIELD

The present invention relates to a method for detecting a surface state of a raw material melt in single crystal production by a Czochralski method (CZ method), a method for producing a single crystal, and an apparatus for producing a CZ single crystal. In particular, the present invention relates to a method for detecting solidification and melting completion with an apparatus for producing a single crystal in a preparation process of pulling a single crystal.

BACKGROUND ART

It is known that in order to produce a plurality of single crystal ingots with a single crucible (quartz crucible), apparatuses for pulling a single crystal by the Czochralski method use a method in which a single crystal is grown and pulled, a solid raw material is further supplied (hereinafter also referred to as recharging) to the crucible through a supply pipe in such an amount that corresponds to a reduced amount of a raw material for a melt, and then melted, and a next single crystal is grown and pulled. When the solid raw material is directly supplied to the melt in the crucible during recharging, unfortunately, the melt may splash and the raw material may be attached to the outside of the crucible or the supply pipe.

As a countermeasure for this, a technology in which the initial single crystal is pulled, the surface of the melt remaining in the crucible is then solidified to some extent, and the raw material is supplied onto the solidified surface by recharging and melted is used. As a conventional technology, a method for visually observing, a solidification state of a melt surface by an operator, or a method in which a signal detected with a visual sensor for diameter control is processed with image processing like Patent Document 1 is disclosed.

For detection of melting completion, a method for visually and periodically observing a state in a quartz crucible by an operator, a detection method using the number of white pixels that are obtained by binarizing an image of the inside of a crucible taken with a two-dimensional CCD camera like Patent Document 2, a method for detecting melting completion using a change in the variation width of melt surface temperature data or using data obtained by binarizing an image of the inside of a furnace taken with a camera that are all zero (black) like Patent Document 3, and a method for detecting melting completion using a change in the concentration of carbon monoxide in an exhaust gas like Patent Document 4 are disclosed.

Patent Document 5 discloses a to technology using two CCD cameras as a means for detecting a position of a raw material in a melting process, which is to measure a distance from a difference (parallax) between views of the two cameras based on the principle of triangulation.

PATENT LITERATURE

Patent Document 1: JP 3632427 B
Patent Document 2: JP 2000-264780 A
Patent Document 3: JP 3704710 B
Patent Document 4: JP 6390606 B
Patent Document 5: JP 2017-77981 A

SUMMARY OF INVENTION

Technical Problem

For detection of solidification, the conventional technology uses the visual sensor for diameter control, and therefore a camera visual field required to detect the diameter of a crystal is only obtained. The conventional technology thus has a problem that the situation of solidification throughout the crucible cannot be grasped. The conventional technology mainly aims to detect the diameter of a crystal, and generally adjusts an imaging condition, such as a diaphragm and a shutter speed of a camera, such that the contrast between a meniscus ring and a melt is high. After binarization to stabilize the detection of diameter, an edge of the meniscus ring is extracted in a constant scan direction within a test region as a diameter signal, and control is performed using this signal so as to achieve a desired crystal diameter. However, there is a problem that a change in diameter is unlikely to appear since the brightness of solidification formed on the surface of the melt is lower than that of the meniscus ring during the detection of diameter. Moreover, a method for extracting the edge in the constant scan direction is unsuitable for the detection of solidification since solidification is not formed in a uniform direction. Therefore, the conventional technology has a problem about the detection of solidification with a camera.

In an example of a method using the visual sensor of the conventional technology as describe above for detection of melting completion, melting completion is determined using the number of white or black pixels in a binarized image. However, there is a problem about accuracy of timing when melting completion is detected. In any case, a procedure capable of detecting solidification timing and melting completion timing more precisely than the conventional technology is required. This is because excessive development of solidification damages the quartz crucible and delayed discovery of melting completion reduces the single crystal productivity with the apparatus. In addition, a reduction in the workload of an operator, such as visual check, is required.

The present invention has been made in view of the above-described circumstances. An object of the present invention is to provide a method for detecting a surface state of a raw material melt that can automatically and precisely detect solidification timing or melting completion timing of the raw material melt and reduce the load of an operator in single crystal production by a CZ method, a method for producing a single crystal, and an apparatus for producing a CZ single crystal.

Solution to Problem

To achieve the object, the present invention provides a method for detecting a surface state of a raw material melt in a quartz crucible in single crystal production by a CZ method in which a raw material contained in the quartz crucible is melted with a heater and a single crystal is pulled from the raw material melt, the method including:

- photographing a predetermined same test region of the surface of the raw material melt in the quartz crucible simultaneously in different directions with two CCD cameras to obtain measurement images of the test region; and automatically detecting, using parallax data of the measurement images from the two CCD cameras, one or more of the following: solidification timing when a state in which the raw material is completely melted becomes a state in which solidification is formed on the surface of the raw material melt; and melting complication timing when a state in which the raw material melt has solidification on the surface of the raw material melt becomes a completely melted state.

Such a detection method of the present invention can simply and surely grasp a change in the state of the raw material melt (melt) in the quartz crucible using the parallax data and achieve a high detection accuracy. In addition, the method can detect solidification and melting completion, similarly. Therefore, the method can prevent damaging the quartz crucible due to excessive development of solidification and reducing the productivity with an apparatus due to delayed discovery of melting completion. The automatic detection of solidification and melting completion can omit visual observation and reduce the workload of an operator.

In this case, as the parallax data of the measurement images, a parallax ratio obtained by dividing the parallax data within the test region by an area of the test region can be used.

Thus, the parallax ratio can be used to simply detect the solidification and melting completion of the raw material melt.

The solidification timing to be detected can be defined as timing when the parallax ratio is 10% or more. The melting completion timing to be detected can be defined as timing when the parallax ratio of 3% or less continues for 5 minutes or more.

Under such references, the method can more appropriately and stably grasp the solidification timing and the melting completion timing. Further, false detection in which a state in which solidification is not formed is determined to be solidification formed or a state in which the raw material or solidification remains without being melted is determined to be melting completion can be more surely prevented.

After pulling the single crystal, the solidification timing can be detected followed by recharging with the raw material, and during melting of the raw material which is recharged, the melting completion timing can be detected followed by pulling a next single crystal.

Thus, the solidification timing and the melting completion timing can be simply and surely detected in production of a plurality of single crystals by recharging, and the productivity of single crystals can be improved.

The present invention provides a method for producing a single crystal by a CZ method in which a raw material contained in a quartz crucible is melted with a heater and a single crystal is pulled from a raw material melt, the method including:

automatically controlling a power of the heater, a position of the quartz crucible, and a position of the heater so as to satisfy a condition of a subsequent process under automatic detection of the solidification timing or the melting completion timing by the method for detecting a surface state of a raw material melt of the present invention when a next single crystal is pulled after pulling the single crystal, recharging with the raw material, and melting the raw material.

According to such a method for producing a single crystal of the present invention, a single crystal producing apparatus can be simply and efficiently operated in production of a plurality of single crystals by recharging, and the single crystals can be pulled with a high productivity.

The present invention provides an apparatus for producing a CZ single crystal that is equipped with a quartz crucible for containing a raw material and a heater for melting the raw material in the quartz crucible to form a raw material melt and pulls a single crystal from the raw material melt, the apparatus including:

two CCD cameras for photographing a predetermined same test region of a surface of the raw material melt in the quartz crucible simultaneously in different directions;

an image processor for obtaining, from measurement images of the test region obtained by photographing with the two CCD cameras, parallax data of the measurement images; and one or more of a solidification detection processor and a melting completion detection processor;

the solidification detection processor automatically detecting, from the parallax data of the measurement images, solidification timing when a state in which the raw material is completely melted becomes a state in which solidification is formed on the surface of the raw material melt, the melting completion detection processor automatically detecting, from the parallax data of the measurement images, melting completion timing when a state in which the raw material melt has solidification on the surface of the raw material melt becomes a completely melted state.

Such an apparatus of the present invention can simply and surely grasp a change in the state (solidification and melting completion) of the raw material melt and achieve a high detection accuracy. Thus, the apparatus can prevent damaging the quartz crucible due to excessive development of solidification, prevent reducing the productivity with the apparatus due to delayed discovery of melting completion, and reduce the workload of an operator.

In this case, the parallax data of the measurement images can be defined as a parallax ratio obtained by dividing the parallax data within the test region by an area of the test region.

Such an apparatus can simply detect the solidification and melting completion of the raw material melt.

The solidification timing to be detected can be defined as timing when the parallax ratio is 10% or more. The melting completion timing to be detected can be defined as timing when the parallax ratio of 3% or less continues for 5 minutes or more.

Under such references, the apparatus can more appropriately and stably grasp the solidification timing and the melting completion timing and more surely prevent false detection.

The apparatus further includes a controller for controlling a power of the heater, a position of the quartz crucible, and a position of the heater, the controller can automatically control the power of the heater, the position of the quartz crucible, and the position of the heater so as to satisfy a condition of a subsequent process according to the solidification timing detected by the solidification detection processor or the melting completion timing detected by the melting completion detection processor.

Such an apparatus can pull a single crystal with a high productivity under simple and efficient operation.

Advantageous Effects of Invention

As described above, the method for detecting a surface state of a raw material melt, the method for producing a single crystal, and the apparatus for producing a CZ single crystal of the present invention can simply and surely grasp a change in the state (solidification and melting completion) of the raw material melt with a high detection accuracy. This can prevent damaging the quartz crucible due to excessive development of solidification, prevent reducing the productivity of a single crystal to be pulled due to delayed discovery of melting completion, and reduce the workload of an operator.

BRIEF DESCRIPTION OF DRAWINGS

FIG. 1 is a schematic view of an exemplary apparatus for producing a CZ single crystal of the present invention.

FIG. 2 is a drawing of an exemplary image taken with one of CCD cameras.

FIG. 3 is a graph showing a change in parallax ratio when solidification is formed after pulling a single crystal in Example 1.

FIG. 4 is a graph showing a change in parallax ratio when after supply of a raw material, melting completion is observed in Example 2.

FIG. 5 is a graph showing a change in the output (diameter data) of a visual sensor for diameter detection when solidification is formed after pulling a single crystal in Comparative Example.

DESCRIPTION OF EMBODIMENTS

As described above, there conventionally have been demands for a procedure capable of detecting solidification and melting completion of a raw material melt in pulling of a single crystal by a CZ method (particularly in a case of recharging).

The present inventor has earnestly studied. Since there is no characteristic edge even under observation of a surface of a melt in a melt state in detection of solidification, views of two right and left CCD cameras are the same, and a parallax is substantially zero. However, when solidification is formed, linear patterns with contrast in various directions appear on a surface of the solidification, and a considerably large amount of parallax is obtained. This is because during the occurrence of solidification, a position where the solidification is detected in photographing varies depending on a difference in angle between the two CCD cameras. This difference is a parallax between the two CCD cameras. Detection of melting completion is also considered similarly. When the raw material is completely melted away, characteristic patterns are eliminated, and parallax to be obtained is reduced.

The present inventor has focused on an increase a reduction in the amount of data about the parallax (for example, the number of pixels where parallax is generated) and considered that the increase or reduction can be applied to the detection of solidification or melting completion. Thus, the present invention has been completed.

Hereinafter, embodiments will be described with reference to the drawings, but the present invention is not limited to the embodiments.

FIG. 1 is a schematic view of an exemplary apparatus for producing a CZ single crystal of the present invention.

An apparatus 20 includes a main chamber 1 and a pulling chamber 2. Over a lower portion of the pulling chamber 2 to an upper portion of the main chamber. 1, a purge tube 3 made of carbon is disposed. In the main chamber 1, a quartz crucible 6 for containing a raw material 4 (containing a solidified raw material melt) and a raw material melt 5, and a graphite crucible 7 disposed outside the quartz crucible 6 are vertically movably supported by a support shaft 8. Around the quartz crucible 6 and the graphite crucible 7, a cylindrical heater 9 for melting the raw material 4, for example, made of a carbon material, is disposed. Around the heater 9, a heat insulating material 10 is disposed. The heater 9 can be driven by a means not shown in the drawing, and the position thereof can be adjusted.

The main chamber 1 has an observation window 12 at the upper portion thereof. Two CCD cameras (simply referred to as cameras) 11 for photographing a surface state of the raw material melt 5 in the quartz crucible 6 through the observation window 12 are provided outside of the main chamber 1. The two CCD cameras 11 can photograph a predetermined same test region of the surface of the raw material melt 5 simultaneously in different directions.

The apparatus 20 further includes an image processor 13, a solidification detection processor 14, a melting completion detection processor 15, and controller. 16, which may be, for example, a computer. (program, etc.). This computer is connected to the CCD cameras 11, the heater. 9 (and a drive means thereof), and the support shaft 8, and can automatically give instructions for processing images from the CCD cameras 11, adjusting the power and the position of the heater 9, and adjusting the vertical movement of the support shaft 8 (adjusting the positions of the quartz crucible 6 and the graphite crucible 7).

Hereinafter, each part will be described in more detail.

The two cameras 11 are not particularly limited as long as they can each simultaneously obtain a measurement image of the test region. A specialized camera for observing the surface state of the raw material melt can be provided, or for example, a CCD camera for detecting the position of the raw material or detecting the diameter as used conventionally can be used. The type or arrangement of the cameras can be appropriately set such that a camera visual field is made wider to the surface of the raw material melt in the quartz crucible 6.

An image taken with each of the cameras 11 will be described. FIG. 2 illustrates an exemplary image taken with one of the cameras (photographed image). An outer frame is the range of visual field (photographed image) of the camera. On the image, the purge tube 3 is reflected. The purge tube 3 has an aperture. The surface of the raw material melt 5 is reflected through the aperture (raw material melt surface observing region). The image shows that the test region is optionally set (herein, a region surrounded by a dotted line) and a part of the surface of the raw material melt 5 is reflected within the test region. The other camera arranged at a different angle simultaneously photographs the same test region. In the present invention, the image of the part of the test region is referred to as a measurement image.

The image processor 13 acquires parallax data of the measurement images from the measurement images of the test region obtained by photographing with the two cameras 11.

Parallax will be first described. In general, photographed images obtained with two CCD cameras are subjected to stereo matching, to determine a difference (parallax) in the position of a corresponding location between the two images. The parallax is used in measurement of a distance based on the principle of triangulation, but in the present invention, attention is paid to the amount of parallax data.

Herein, the “parallax data of the measurement images” in the present invention will be described. As the “parallax data of the measurement images”, for example, a parallax ratio that is a value obtained by dividing the “parallax data within the test region" by the "area of the test region" can be used. The test region is set within a range where the raw material melt 5 in the quartz crucible 6 can be observed through the observation window 12 as described above. For example, a value obtained by dividing the number of pixels of parallax within the test region by the number of pixels per the area can be used as the parallax ratio in the detection of solidification and melting completion.

Hereinafter, more specific description will be given. When in a state in which solidification is not formed on the surface of the raw material melt as described above, there is no characteristic edge, views of two right and left cameras are apparently the same, and a parallax is substantially zero (since separate photographing is performed with the two cameras, parallax is generally generated, but a difference is not made between two measurement images of the test region in the melt state). However, when solidification is formed, a linear pattern with contrast appears on the surface of the solidification, and parallax is clearly obtained. That is, a difference (parallax) in the position of the corresponding location (the linear pattern, etc.) between the two measurement images taken with the two cameras is clearly made within the photographed test region. The total number of points (for example, pixels) in such a location (if there are a plurality of locations, all the locations) that is a seemingly different position within the test region may be the "parallax data within the test region". For example, the "area of the test region" may be the number of points (pixels) in the test region. As described above, the parallax ratio (an example of the "parallax data of the measurement images") is a value obtained by dividing a value of the "parallax data within the test region" by a value of the "area of the test region". When such data is used, the measurement principle is simple, and the data can be simply obtained from the measurement images. Therefore, the solidification and melting completion of the raw material melt can be simply detected.

Note that a criterion for parallax (a criterion by which to determine whether pixels of two measurement images are the same or different) is not particularly limited, and can be appropriately set.

The solidification detection processor 14 automatically detects, from the parallax data (parallax ratio) of the measurement images acquired by the image processor, the solidification timing when a state in which the raw material is completely melted becomes a state in which solidification is formed on the surface of the raw material melt 5. For example, the solidification timing to be detected can be defined as timing when the parallax ratio is 10% or more. In this case, solidification can be stably detected. Note that the upper limit of parallax ratio that is a reference for detection of solidification timing cannot be limited. This is because when solidification occurs, the parallax ratio to be obtained may largely vary depending on the arrangement condition of the two cameras.

The melting completion detection processor 15 automatically detects, from the parallax data (parallax ratio) of the measurement images, melting completion timing when a state in which the raw material melt 5 has solidification on the surface of the raw material melt 5 becomes a completely melted state. For example, the melting completion timing to be detected can be set as timing when the parallax ratio of 3% or less continues for 5 minutes or more. A small amount of unmelted raw material may be suspended in the raw material melt, and therefore the absence of parallax for approximately 5 minutes can be sufficiently determined to be melting completion. When the certainty of melting completion is required, the upper limit of time that is a reference for detection of melting completion timing cannot be limited. This is because a longer time increases the certainty. The lower limit of the parallax ratio that is the reference may be, for example, 0%.

Under these references (thresholds), the solidification timing and the melting completion timing can be more appropriately grasped, and false detection can be more surely prevented. The time and the parallax ratio are not limited to these references and can be appropriately determined.

The apparatus may include at least one or both of the solidification detection processor 14 and the melting completion detection processor 15. It is preferable that the apparatus includes both the processors since both the detection of the solidification timing and the detection of the melting completion timing can be appropriately performed.

The controller 16 automatically controls the power of the heater 9, the position of the quartz crucible 6, and the position of the heater 9 so as to satisfy a condition of a subsequent process according to the solidification timing detected by the solidification detection processor. 14 or the melting completion timing detected by the melting completion detection processor 15.

Particularly in an apparatus used to produce a plurality of single crystals by recharging, when after pulling a single crystal, the surface of the raw material melt is solidified once for recharging with the raw material, when the raw material which is recharged and the solidified raw material are completely melted, or when a next single crystal is pulled after complete melting, there are suitable conditions, such as the power and the position of the heater 9 and the position of the quartz crucible 6. In the detection of solidification timing by the solidification detection processor 14, the controller 16 can control various adjustments of the heater 9 and the quartz crucible 6 such that the conditions are setting conditions suitable for recharging with the raw material that is the subsequent process. In the detection of melting completion timing by the melting completion detection processor 15, the controller 16 can control various adjustments of the heater 9 and the quartz crucible 6 such that the conditions are setting conditions suitable for pulling a single crystal that is the subsequent process. Automatic control is more preferred.

Such a CZ single crystal producing apparatus 20 of the present invention can simply detect the solidification or melting completion of the raw material melt, or both with a high detection accuracy. Therefore, particularly in production of a plurality of single crystals by recharging with the raw material, damage to the quartz crucible and a reduction in productivity in single crystal production, which are due to solidification of the raw material melt in a larger amount than necessary and melting completion overlooked, can be simply and surely prevented. Furthermore, the apparatus can perform automatic detection, and therefore conventional observation, such as visual check by an operator, can be omitted or reduced.

Next, the method for detecting a surface state of a raw material melt and the method for producing a single crystal of the present invention using the CZ single crystal producing apparatus 20 in FIG. 1 will be described. A process of producing a plurality of single crystals by recharging with the raw material while the surface state of the raw material melt is detected will be described.

When a single crystal is pulled using the CZ single crystal producing apparatus 20, an inert gas such as Ar is supplied from the upper portion of the pulling chamber. 2 while the inert gas is discharged from the lower portion of the main chamber 1. The chambers 1 and 2 are filled with the inert gas under a reduced pressure.

For example, the quartz crucible 6 contains a polycrystal silicon as the raw material. This raw material is heated and melted with the heater 9 to obtain the raw material melt 5. Subsequently, a wire not shown in the drawing is gradually lowered f cm an upper portion of the pulling chamber 2, a seed crystal attached to the lower end of the wire is immersed in (in contact with) the raw material melt 5 in the quartz crucible 6.

The quartz crucible 6 is rotated through the support shaft 8 with a motor and the like at a predetermined speed, and the wire is rotated in a direction opposite to the direction of the quartz crucible 6 and slowly wound upward. Thus, the seed crystal and then a single crystal are pulled with the single crystal growing, and a neck, a cone, then a body, and finally a tail are formed, and then pulled into the pulling chamber 2.

After the single crystal is pulled as describe above, the heater 9 and the quartz crucible 6 are controlled with respect to a heater power, a crucible position, and a heater position for solidification before recharging that is the subsequent process. After the control as predetermined, the observation of solidification is initiated. Specifically, the parallax ratio is sequentially and automatically obtained from the measurement images of the test region by the two cameras 11, the image processor 13, and the solidification detection processor 14. When the parallax ratio reaches a predetermined reference (for example, the parallax ratio reaches 10% or more), solidification timing is automatically detected. When such solidification timing is detected, the controller. 16 automatically controls the heater power and the like to desired heater power and the like for melting, and the raw material is additionally supplied by recharging.

After the supply of the raw material is completed, melting completion is observed with the raw material melted. Specifically, the parallax ratio is sequentially and automatically obtained again from the measurement images of the test region by the two cameras 11, the image processor 13, and the solidification detection processor 14. When the parallax ratio reaches a predetermined reference (for example, a parallax ratio of 3% or less continues for 5 minutes or more), melting completion timing is automatically detected. When such melting completion timing is detected, the controller 16 automatically controls the heater power and the like to desired heater power and the like for single crystal pulling, and a next single crystal is pulled.

A series of the operations is automatically performed.

According to such a detection method and such a production method, the solidification and melting completion of the raw material melt can be simply and highly precisely grasped, the single crystal can be continuously produced with a high productivity, and the load of an operator can be reduced.

EXAMPLE

The present invention will be more specifically described below with reference to Examples and Comparative Example, but the present invention is not limited to these examples.

Example 1

After pulling a single crystal, the method for detecting solidification timing of the present invention was performed using the CZ single crystal producing apparatus 20 of the present invention shown in FIG. 1 in a process of forming solidification of a raw material melt, followed by recharging with a raw material.

A production condition included a crucible diameter of 800 mm and a weight of the raw material melt (melt) of 400 kg, and two CCD cameras were attached to the outside of an observation window of a main chamber as shown in FIG. 1. An observation image of a surface of the raw material melt is as shown in FIG. 2. In order to confirm the surface of the raw material melt within a same test region through an aperture of a purge tube, the visual fields of the CCD cameras were set to approximately 500 mm in an X direction and approximately 375 mm in a Y direction, and the test region for solidification and melting completion corresponded to 300 mm in the X direction and 100 mm in the Y direction, and the test region for both solidification and melting completion exhibited 450×150 pixels and an area of 67,500 pixels.

A change in parallax ratio when solidification is formed after pulling a single crystal is shown in FIG. 3. A horizontal axis represents an elapsed time from an optional point in the process, and a vertical axis represents the parallax ratio within the test region for observation of solidification. Since in a melt state, there is almost no information about a difference in the position of a corresponding location between two measurement images, the parallax ratio is approximately 0 and is stable. However, at the moment when solidification is formed on the surface of the raw material melt, linear patterns with contrast in various directions appear, and the parallax ratio is rapidly increased. The threshold of detection of solidification timing was set to 10% or more, and the detection of solidification timing was at 212 minutes.

For verification, an operator visually observed at the same time. Almost at the same timing as described above, the operator determined that solidification was formed (in FIG. 3, "solidification forming point", 211 minutes).

Example 2

After completion of Example 1, the method for detecting melting completion timing of the present invention was performed in a process of additionally supplying and melting the raw material.

A change in parallax ratio when after supplying the raw material, melting completion is observed is shown in FIG. 4. A horizontal axis represents an elapsed time from an optional point in the process, and a vertical axis represents the parallax ratio within the test region for observation of melting completion. A rapid reduction in parallax ratio like solidification in Example 1 is not observed since at the latter half of melting, an unmelted raw material in a small lump form is suspended in the quartz crucible. However, in a complete melt state, the parallax ratio is substantially 0 and is stable. The threshold of detection of melting completion timing was set to continuing a parallax ratio of 3% or less over approximately 5 minutes, and the detection of melting completion timing was at 406 minutes (in FIG. 4, "melting completion detecting point").

For verification, an operator visually observed at the same time. Almost at the same timing as described above, the operator determined that melting was completed (405 minutes).

Comparative Example

During the detection of solidification in Example 1, a visual sensor for diameter detection based on the conventional technology was also used for the detection of solidification.

At that time, the visual field of camera was set to approximately 220 mm in the X direction and approximately 165 mm in the Y direction, and a detection region of solidification corresponded to approximately 80 mm in the X direction and approximately 80 mm in the Y direction (582×582 pixels). A scan direction for detecting an edge for detection of solidification is a direction toward a center from a wall of the quartz crucible. When diameter data as an output signal of the visual sensor for diameter detection reaches 150 mm or more, solidification is considered to be completed in detection.

A change of output in this case is shown in FIG. 5. A horizontal axis represents an elapsed time from an optional point in the process, and a vertical axis represents the output (diameter data) of the visual sensor for diameter detection. Even when solidification was formed actually, a change in output data was not seen, and the solidification could not be detected. To give priority an imaging condition and binarization such that a meniscus having the highest brightness in the melt can be stably detected for diameter control, a change in an output value that can be used in solidification detection cannot be expected among differences in contrast between the melt and a solidified portion during observation of solidification.

When the imaging condition and the threshold of binarization are changed depending on a process, the solidification may be detected, but the process is complicated.

In the present invention, detection can be simply and highly precisely performed like Example 1.

It should be noted that the present invention is not limited to the above-described embodiments. The embodiments are just examples, and any examples that substantially have the same feature and demonstrate the same functions and effects as those in the technical concept disclosed in claims of the present invention are included in the technical scope of the present invention.

The invention claimed is:

1. A method for detecting a surface state of a raw material melt in a quartz crucible in single crystal production by a CZ method in which a raw material contained in the quartz crucible is melted with a heater and a single crystal is pulled from the raw material melt, the method comprising:

photographing a predetermined same test region of the surface of the raw material melt in the quartz crucible simultaneously in different directions with two CCD cameras to obtain measurement images of the test region; and automatically detecting, using parallax data of the measurement images from the two CCD cameras, one or more of the following: solidification timing when a state in which the raw material is completely melted becomes a state in which solidification is formed on the surface of the raw material melt; and melting completion timing when a state in which the raw material melt has solidification on the surface of the raw material melt becomes a completely melted state, wherein as the parallax data of the measurement images, a parallax ratio obtained by dividing the number of pixels where parallax is generated within the test region by the number of pixels per an area of the test region is used.

2. The method for detecting a surface state of a raw material melt according to claim 1, wherein the solidification timing to be detected is defined as timing when the parallax ratio is 10% or more.

3. The method for detecting a surface state of a raw material melt according to claim 1, wherein the melting completion timing to be detected is defined as timing when the parallax ratio of 3% or less continues for 5 minutes or more.

4. The method for detecting a surface state of a raw material melt according to claim 2, wherein the melting completion timing to be detected is defined as timing when the parallax ratio of 3% or less continues for 5 minutes or more.

5. The method for detecting a surface state of a raw material melt according to claim 1, wherein after pulling the single crystal, the solidification timing is detected followed by recharging with the raw material, and during melting of the raw material which is recharged, the melting completion timing is detected followed by pulling a next single crystal.

6. The method for detecting a surface state of a raw material melt according to claim 2, wherein after pulling the single crystal, the solidification timing is detected followed by recharging with the raw material, and during melting of the raw material which is recharged, the melting completion timing is detected followed by pulling a next single crystal.

7. The method for detecting a surface state of a raw material melt according to claim 3, wherein after pulling the single crystal, the solidification timing is detected followed by recharging with the raw material, and during melting of the raw material which is recharged, the melting completion timing is detected followed by pulling a next single crystal.

8. The method for detecting a surface state of a raw material melt according to claim 4, wherein after pulling the single crystal, the solidification timing is detected followed by recharging with the raw material, and during melting of the raw material which is recharged, the melting completion timing is detected followed by pulling a next single crystal.

9. A method for producing a single crystal by a CZ method in which a raw material contained in a quartz crucible is melted with a heater and a single crystal is pulled from a raw material melt, the method comprising:

automatically controlling a power of the heater, a position of the quartz crucible, and a position of the heater so as to satisfy a condition of a subsequent process under automatic detection of the solidification timing or the melting completion timing by the method for detecting a surface state of a raw material melt according to claim 1 when a next single crystal is pulled after pulling the single crystal, recharging with the raw material, and melting the raw material.

10. An apparatus for producing a CZ single crystal that is equipped with a quartz crucible for containing a raw material and a heater for melting the raw material in the quartz crucible to form a raw material melt and pulls a single crystal from the raw material melt, the apparatus comprising:

two CCD cameras for photographing a predetermined same test region of a surface of the raw material melt in the quartz crucible simultaneously in different directions;

an image processor for obtaining, from measurement images of the test region obtained by photographing with the two CCD cameras, parallax data of the measurement images; and one or more of a solidification detection processor and a melting completion detection processor;

the solidification detection processor automatically detecting, from the parallax data of the measurement images, solidification timing when a state in which the raw material is completely melted becomes a state in which solidification is formed on the surface of the raw material melt, the melting completion detection processor automatically detecting, from the parallax data of the measurement images, melting completion timing when a state in which the raw material melt has solidification on the surface of the raw material melt becomes a completely melted state, wherein the parallax data of the measurement images is a parallax ratio obtained by dividing the number of pixels where parallax is generated within the test region by the number of pixels per an area of the test region.

11. The apparatus for producing a CZ single crystal according to claim 10, wherein the solidification timing to be detected is defined as timing when the parallax ratio is 10% or more.

12. The apparatus for producing a CZ single crystal according to claim 10, wherein the melting completion timing to be detected is defined as timing when the parallax ratio of 3% or less continues for 5 minutes or more.

13. The apparatus for producing a CZ single crystal according to claim 11, wherein the melting completion timing to be detected is defined as timing when the parallax ratio of 3% or less continues for 5 minutes or more.

14. The apparatus for producing a CZ single crystal according to claim 10, further comprising:

a controller for controlling a power of the heater, a position of the quartz crucible, and a position of the heater, the controller automatically controls the power of the heater, the position of the quartz crucible, and the position of the heater so as to satisfy a condition of a subsequent process according to the solidification timing detected by the solidification detection processor or the melting completion timing detected by the melting completion detection processor.

* * * * *